United States Patent
d'Auria et al.

(10) Patent No.: US 6,243,042 B1
(45) Date of Patent: Jun. 5, 2001

(54) OPTOELECTRONIC SYSTEM FOR THE TESTING OF AN ANTENNA

(75) Inventors: Luigi d'Auria, Sceaux; Jean Chazelas, Paris; Jean-Charles Renaud, St Cheron; Maxime Lailler, St Remy l'Honore, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/218,153

(22) Filed: Dec. 22, 1998

(30) Foreign Application Priority Data

Dec. 23, 1997 (FR) .................................................. 97 16337

(51) Int. Cl.[7] .................................................. G01R 29/08
(52) U.S. Cl. .................................................. 343/703
(58) Field of Search .................................. 343/703, 853; 350/145, 146; H01Q 15/00

(56) References Cited

U.S. PATENT DOCUMENTS

| | | | | |
|---|---|---|---|---|
| Re. 35,736 | * | 2/1998 | Powell | 343/853 |
| 3,879,733 | * | 4/1975 | Hansen et al. | 343/703 |
| 4,091,327 | * | 5/1978 | Larsen et al. | 343/703 |
| 4,303,300 | | 12/1981 | Pressiat et al. | 350/96.2 |
| 4,529,986 | | 7/1985 | d'Auria et al. | 343/853 |
| 4,833,476 | * | 5/1989 | Dutcher | 343/703 |
| 4,954,834 | * | 9/1990 | Buck | 343/703 |
| 5,057,848 | * | 10/1991 | Rankin et al. | 343/703 |

* cited by examiner

*Primary Examiner*—Michael C. Wimer
(74) *Attorney, Agent, or Firm*—Oblon, Spivak, McClelland, Maier & Neustadt, P.C.

(57) ABSTRACT

This optoelectronic system for the testing of a main antenna comprises: a test antenna designed to be placed in the field of transmission or reception of the main antenna; an optoelectronic component associated with the test antenna alternatively receiving and sending optical signals from/to remote transmitters/receivers and receiving and/or sending optical signals from/to the test antenna; an electric matching circuit connected between the optoelectronic component and the test antenna. This system thus enables the testing on the spot of an antenna (for example a radar antenna) without disturbing the radiation pattern of this antenna. This semiconductor component is therefore alternatively a modulator or a detector of light radiation, and it is connected by optical fibers to emitters and adapted detectors located out of the field of the antennas to be tested. The cables formed by dielectric materials do not disturb the radiation pattern of the antennas. An optoelectronic system is used to overcome the variations in the characteristics of the semiconductor component, thus averting especially a temperature stabilization of this component.

19 Claims, 5 Drawing Sheets

OPTOELECTRONIC SYSTEM FOR THE TESTING OF AN ANTENNA

BACKGROUND OF THE INVENTION

1. Field of the Invention

The invention relates to an optoelectronic system for the testing of an antenna. It relates more particularly to an optoelectronic device that is alternatively a transmitter and a detector of a radiofrequency signals and enables the testing of an antenna (for example a radar antenna) without disturbing its radiation pattern.

2. Discussion of the Background

Devices for performing optoelectronic tests on antennas have already been made. To carry out tests on an antenna in both transmission and in reception, these devices make use of an assembly of several electronic components dedicated firstly to testing in transmission and secondly to testing in reception. They may therefore comprise:

either a photodiode and a laser diode, or a photodiode and an electro-optical modulator.

The supplies for these devices are generally obtained by local means (cells for example).

SUMMARY OF THE INVENTION

The invention relates to a testing system enabling the use of a single optoelectronic component providing for a remote supply.

The device is essentially formed by an antenna connected to a single semiconductor component that is alternatively a modulator or a detector of light radiation connected by optical fibers to transmitters and adapted detectors located outside the field of the antenna to be tested.

The cables formed by dielectric materials do not disturb the radiation pattern of the antennas.

An optoelectronic system makes it possible to overcome variations in the characteristics of the semiconductor component, preventing especially the temperature stabilization of this component.

The invention therefore relates to an optoelectronic system for the testing of a main antenna, comprising:

- a test antenna designed to be placed in the field of transmission/reception of the main antenna;
- an optoelectronic detector/modulator component for the detection and modulation of a light wave capable of detecting a first light wave and giving an electrical control current and also capable of modulating a second light wave under the control of an electronic modulation current;
- an electric matching circuit connected between the optoelectronic component and the test antenna receiving, firstly, the electrical control current from the optoelectronic component and activating the transmission of the test antenna and receiving, secondly an electrical current from the test antenna and controlling the optoelectronic component in modulation mode;
- a first optical source sending the first light wave to the optoelectronic component;
- a second optical source sending the second light wave towards the optoelectronic component;
- an optoelectronic detector optically coupled to the optoelectronic component and detecting a wave modulated by this component.

BRIEF DESCRIPTION OF THE DRAWINGS

The various objects and characteristics of the invention shall appear more clearly from the following description and from the appended figures, of which.

DETAILED DESCRIPTION OF THE PREFERRED EMBODIMENTS

Figure 1:
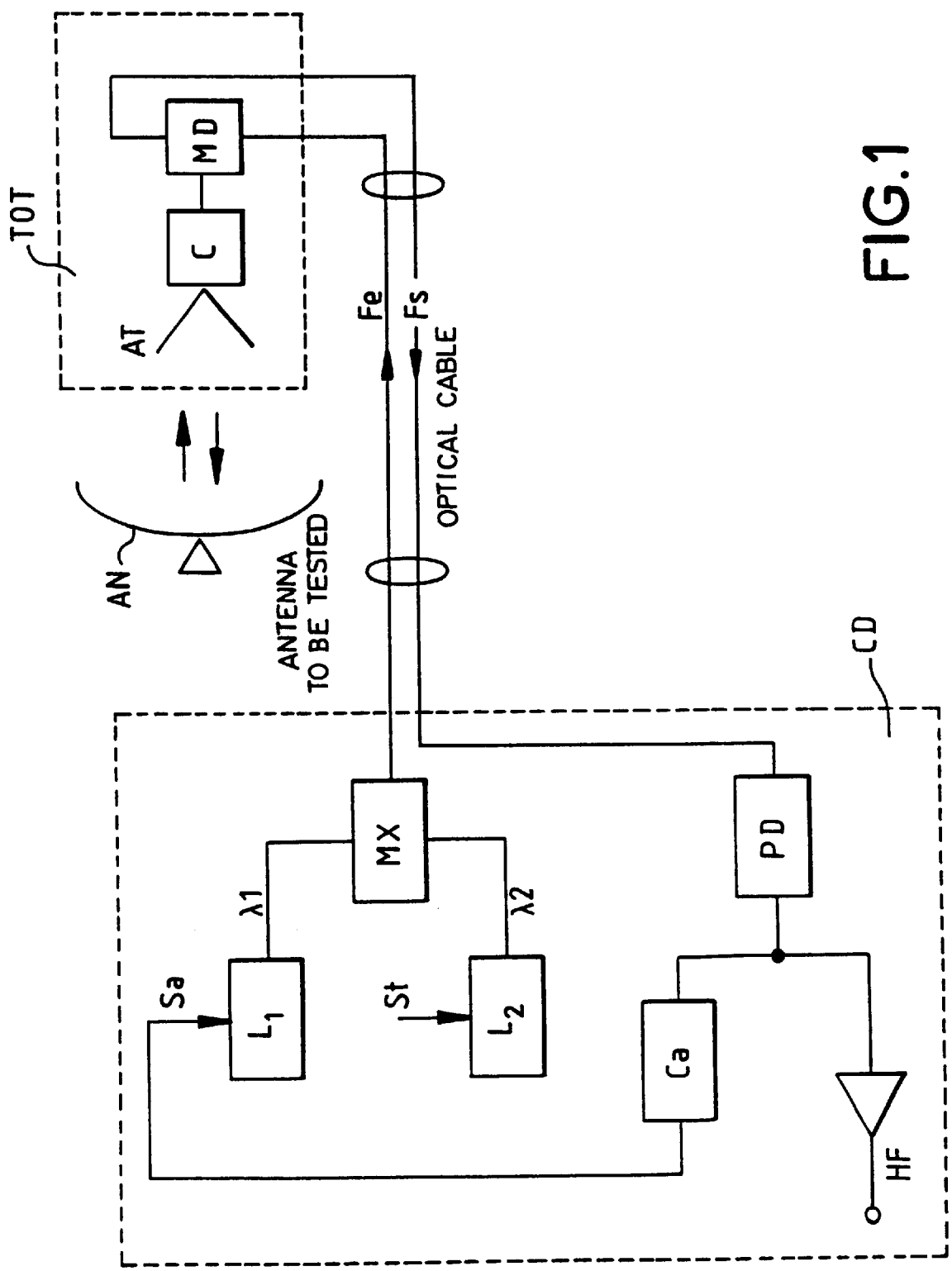
FIG. 1 is a general block diagram of the testing system according to the invention.

Referring to FIG. 1, a description shall first of all be given of a diagram of an embodiment of the invention.

The system comprises a optical test head referenced TOT designed to be placed in the field of transmission/reception of an antenna AN to be tested. It is clear that, in FIG. 1, the respective dimensions of the different elements and their distances with respect to one another are not drawn to scale.

The optical test head TOT proper comprises an optoelectronic component MD which can alternatively modulate or detect a guided optical wave. The component MD is connected electrically to a test antenna AT through a matching and control electronic circuit C and optically to remote circuits CD. This remote link may be made with fibers such as an incoming optical fiber Fe and an outgoing optical fiber Fs.

The incoming optical fiber Fe is connected through an optical multiplexer MX to two laser emitters $L_1$ and $L_2$ respectively emitting wavelengths $\lambda_1$ and $\lambda_2$. $L_1$ is an emitter that is tunable around the wavelength $\lambda_1$ controlled by a signal Sa coming from the circuit Ca. $L_2$ is a laser emitter capable of emitting signals modulated by a radiofrequency signal St.

The outgoing optical fiber Fs is connected to a photodiode PD compatible with radiofrequencies and provided with a high-frequency electrical output HF and a DC output (or low frequency output) connected to the tuning control circuit Ca of the laser emitter $L_1$.

The optical fibers Fe and Fs are made of dielectric material and do not disturb the radiation pattern of the antenna. The component MD is designed to detect the wavelength $\lambda_2$ in such a way that the detected current, by means of the circuit C, activates the transmission by the testing antenna AT of a microwave towards the antenna AN to be tested.

The component MD is also designed to modulate the wavelength $\lambda_1$ under the control of a current given by the circuit C and resulting from the detection by the test antenna AT.

In the reception mode of the antenna AN to be tested, the laser emitter $L_2$ is modulated by a test radiofrequency signal St. This signal, which is communicated to the light radiation at the wavelength $\lambda_2$ sent by $L_2$ is directed through the multiplexer MX and the optical fiber Fe to the optoelectronic component MD acting as a photoreceiver. It is converted into an electrical signal and, through the circuit C, activates the antenna AT which in turn sends this test signal to the antenna AN to be tested.

The antenna AN to be tested detects the signal and identifies it. After analysis of the characteristics of this signal, it is possible therefrom to deduce the properties of the antenna AN in reception.

In the transmission mode of the antenna AN to be tested, it sends a wave. A part of the electromagnetic radiation sent is picked up by the antenna AT and converted into a control voltage of the optoelectronic component MD acting as a light modulator. Furthermore, under the control of a means not shown, this continuous optical radiation at the wavelength $\lambda_1$ coming from the transmitter $L_1$ is sent through the multiplexer MX and the optical fiber Fe to the input of MD. This radiation at the wavelength $\lambda_1$ is modulated in the modulator MD by the signal picked up by the test antenna AT. The modulated optical signal coming from MD is conducted through the fiber Fs to the photoreceptor PD which converts it into an electrical signal available at the output HF. A circuit CF detects the modulation frequency and compares it with the transmission frequency of the antenna AN to identify it. The properties of the antenna AN in transmission can be deduced from the characteristics of the signal.

Modulator/detector (MD)

The optoelectronic function of the invention achieved by the modulator/detector component MD consists therefore in:

1) detecting a light signal at a wavelength $\lambda_2$ and converting it into an electrical signal;
2) modulating a continuous light signal propagating at the wavelength $\lambda_1$.

These two functions are performed by the same semiconductor component and during alternating time phases.

Figure 3:
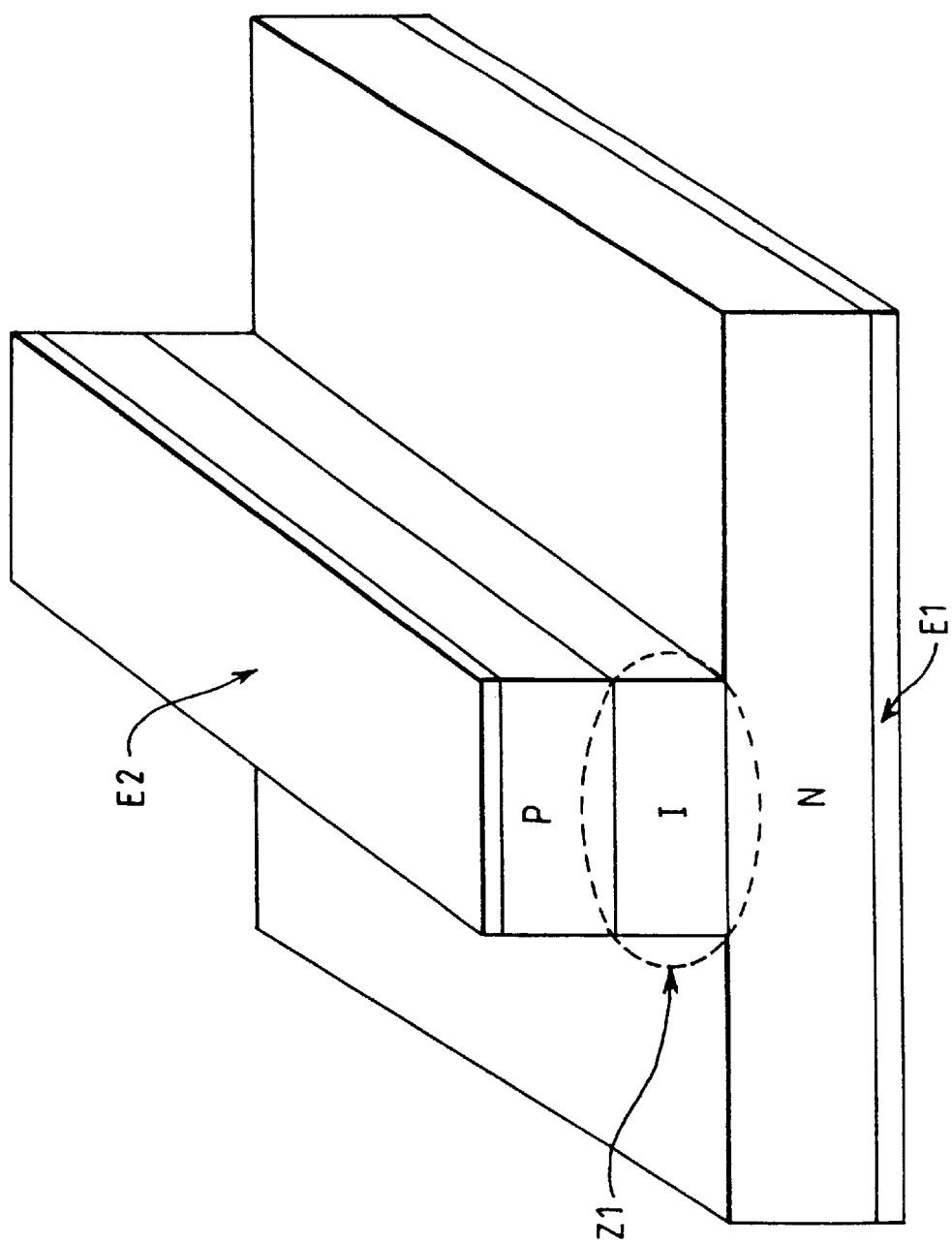
FIG. 3 shows an exemplary embodiment of the modulator/detector component used in the testing system.

FIG. 3 shows an exemplary embodiment of a modulator/detector device according to the invention. This device comprises a stack of layers of semiconductor materials forming a waveguide. For example, on an N doped substrate made of InP, it comprises an active layer of non-doped quaternary alloy GaInAsP and the composition corresponds to an energy $E_Q$ of 0.82 eV (where $\lambda_Q$=1.5 $\mu$m in wavelengths) and a layer of P doped InP. A geometrical demarcation, by photolithography, of these layers is done to obtain a waveguide as well a PIN junction of reduced size.

On either side of these layers, electrodes $E_1$ and $E_2$ enable the junction to be biased. The faces of the device perpendicular to the direction of the guide are cleaned or etched at an angle of 90°. The component receives the light in the zone Z1, namely by an edge. A reflection-preventive treatment of this face enables the photon collection efficiency to be optimized and hence enables the detectivity and efficiency of the modulation to be increased In the transmission mode of the optical test head, a light signal with a wavelength $\lambda_2$ is focused on the detector in the zone Z1. In order that this signal may be detected efficiently by the device, it is necessary to have $\lambda_2 < \lambda_0$. In the above example, where $\lambda_0$=1.5 $\mu$m, the wavelength $\lambda_2$ could come from a standard laser emitting at 1.3 $\mu$m. The photons of the signal $\lambda_2$ are then guided in the active layer and absorbed during this propagation and then converted into electrical current. The component may function without applied voltage (0 V) but its detectivity and speed are improved by a slightly negative voltage (typically −2 V) applied to the terminals of the electrodes E1 and E2.

In reception mode, the optical test head will have the function of modulating the continuous light signal at a wavelength $\lambda_1$. To obtain the modulation effect, $\lambda_1$ will be substantially greater than $\lambda_0$ (typically $\lambda_1$ =1.55 $\mu$m when $\lambda_0$=1.5 $\mu$m). A voltage modulated around a negative value enables the absorption front of the active material to be made to vary and therefore enables the absorption or non-absorption of light. This effect is expressed by a modulation of the intensity of the signal. As in the case of photodetection, the signal is focused in the zone Z1. Depending on the voltage modulation applied, the active material will be absorbent or transparent and the signal will be thus modulated.

The choice of the active quaternary material is a function of operating conditions, especially of $\lambda_1$ and $\lambda_2$ and also of the working temperature of the device.

The light guided in the waveguide and modulated by the voltage applied to the electrodes comes out of the waveguide through the zone Z2 and is transmitted to the photodiode PD.

Figure 4:
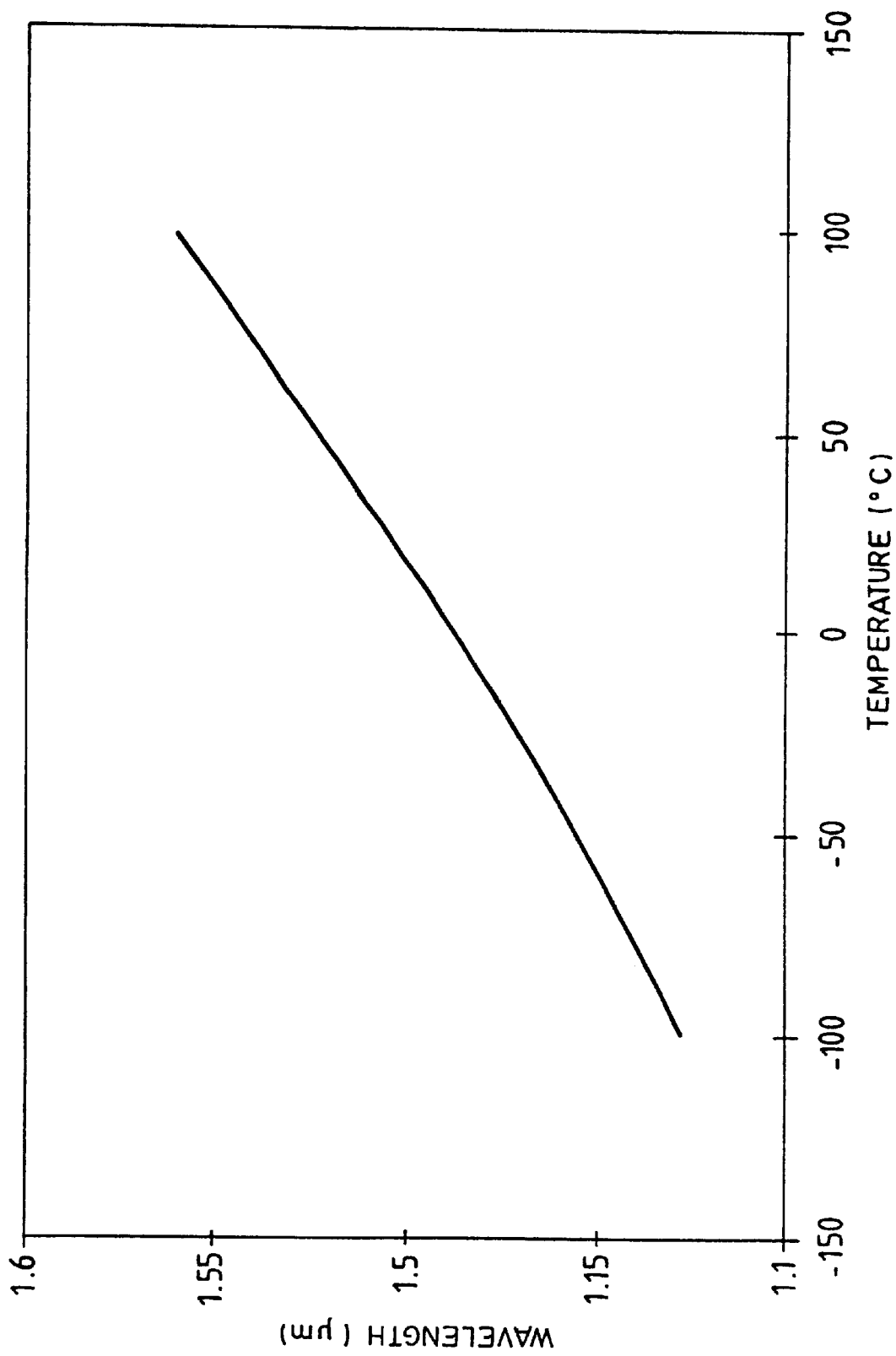
FIG. 4 shows an exemplary wavelength/temperature characteristic of the component of FIG. 3.

FIG. 4 shows the typical variations of $\lambda_0$ as a function of the temperature.

This modulator/detector component MD requires a precise adjusting of the absorption wavelength in modulator mode. This wavelength may be continually optimized by acting on the emission wavelength of the source L1. For this purpose, a circuit Ca detects the level of reception of the photodetector PD and acts by a signal Sa on the emission wavelength $\lambda_1$ of the source L1 so as to have maximum light energy transmitted and detected by the photodetector PD.

Figure 2:
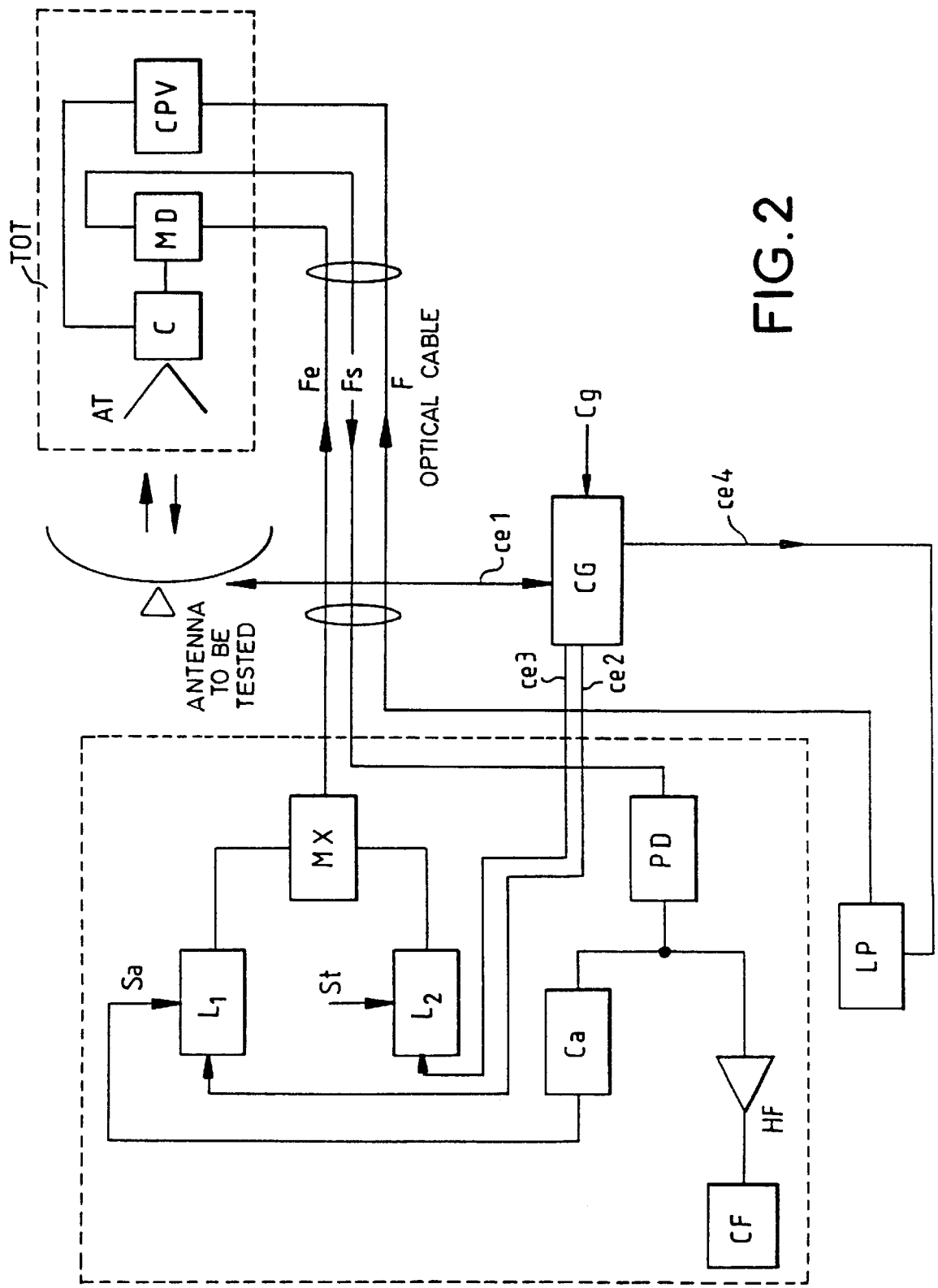
FIG. 2 a block diagram of the system of the invention providing for an optical supply of the system.

The electrical supply of the optical test head TOT may be conventionally provided by a cell associated with the circuits of the head TOT (supply not shown) as shown in FIG. 2, by a photodetector CPV receiving a supply light wave which is converted into electrical energy. According to FIG. 2, the supply light wave is transmitted by a power laser diode LP adapted to the wavelength of sensitivity of the detector CPV and is transmitted by an optical fiber F. This fiber therefore acts as a supply cable. It is made of dielectric material and does not disturb the radiation pattern of the antenna AN.

The supply of the TOT is sized so as to ensure:
the working of the optoelectronic transmitter/modulator component MD (bias voltage of MD for the detection function and the modulation function);
the functions of protection and verification of the efficient operation of the optical test head TOT provided by the electronic matching and control circuit C.

Figure 5:
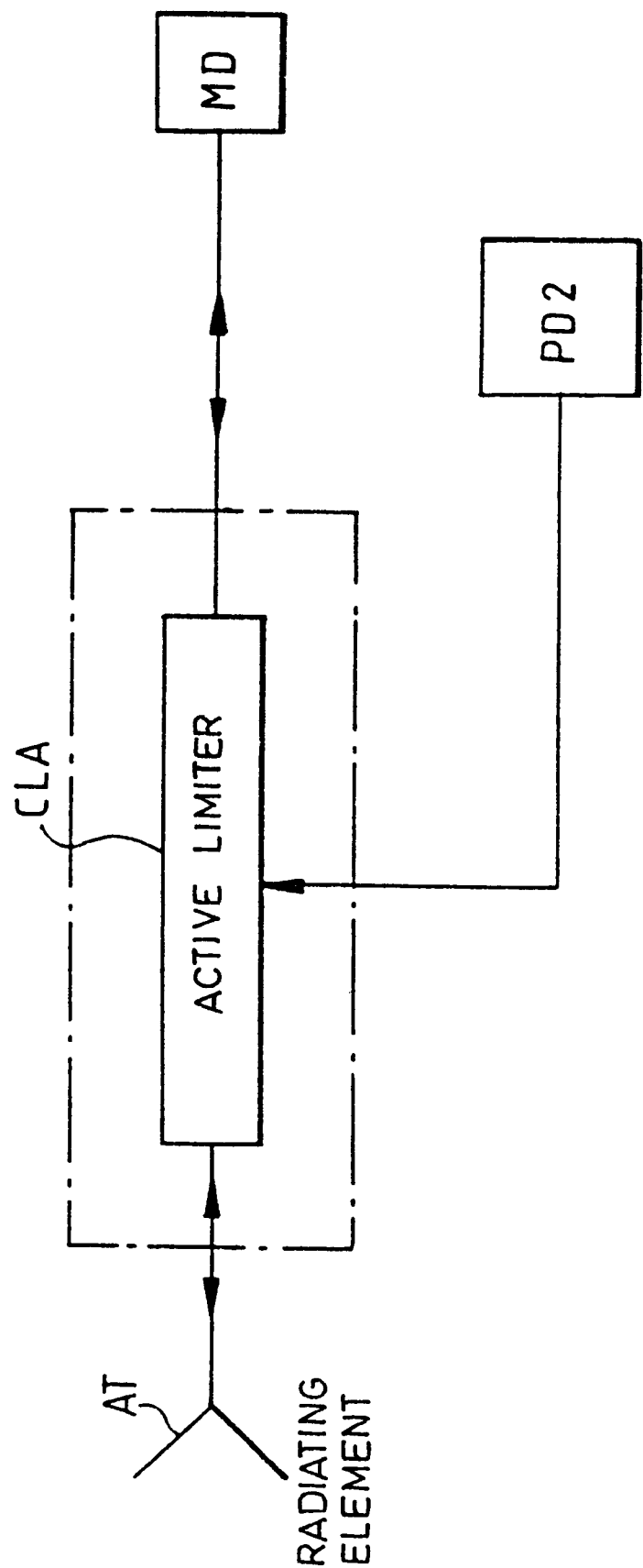
FIG. 5 shows an exemplary electronic circuit for the matching and control of the test antenna.

The various functions fulfilled by the electronic circuit C (FIG. 5) will be understood more clearly from an explanation of the various modes of operation of the TOT, for example before a radar antenna AN:
radar in transmission (normal mode),
test, radar in reception,
test, radar in transmission,
verification of the efficient operation of the TOT.

In normal mode of operation in radar transmission, the TOT is protected against the radiated field by means of a protection circuit which is a limiter. This protection circuit is activated by a command ce4 coming from CG and going through LP. The TOT does not modify the normal operation of the radar.

In the mode of testing and calibrating the antenna AN in reception, the protection circuit is deactivated by the value of the supply voltage, related to the power sent by the laser LP and received by the photodetector CPV. The TOT is then in transmission mode. The component MD is used as a photodiode and delivers the microwave signal received through the optical fiber Fe directly to the radiating element AT.

In the mode of testing the antenna AN in transmission, the radar sends normal power. The protection circuit is activated. It ensures high insertion loss with a known value. The TOT is in reception mode and a signal proportional to the signal received by AT is directly addressed to the component MD used as a modulator of the light received by the fiber Fe.

The efficient operation of the TOT is verified when the radar is transmitting. A modulation of the light sent by LP has the consequence of modulating the supply voltage of the protection circuit. This modulation is carried over to the microwave signal received from the radar through AT and will be expressed by the component MD into a modulation of the light received by Fe. The modulation retransmitted by Fs is then available on the photodetector PD. The analysis of the signal makes it possible to verify the efficient operation of the TOT in reception mode and determine the transfer function of the TOT.

To implement this operation, the system comprises for example a management circuit CG controlled by means not shown. The circuit CG controls the placing of the antenna AN on standby and then successively the testing in transmission mode and reception mode.

For the testing in emission mode, the circuit CG, through the link ce1, controls the transmission by the antenna AN of a wave having a characteristic wavelength. This wave is received by the test antenna AT and the modulator MD. At the same time, the circuit CG uses the link ce2 to control the emission, by the source L1, of a wave $\lambda_2$ which is transmitted to the component MD. This component MD modulates the wave $\lambda_1$ under the control of the signal transmitted by the test antenna AT. The modulated wave is transmitted to the photodiode PD which detects this wave and gives a corresponding electrical signal. This signal is transmitted to the detection circuit CF which detects the modulation and identifies the received signal. The signal is thus capable of indicating whether the antenna AN is working efficiently or not.

For the testing of the antenna AN in reception mode, the circuit CG, through the link ce3, controls the emission by the source L1 of a wave $\lambda_1$. This wave is detected by the component MD which provides an electrical signal to the test antenna AT which sends a test wave to the antenna AN. This antenna detects the test wave and thus enables an indication of efficient or inefficient operation.

Laser L1

L1 may be a GaInAsP laser diode emitting in the 1.5 µm window and tunable in the zone of fluctuation of the absorption wavelength of the component MD working in modulator mode.

The optical test head TOT may be designed to work in a temperature range of −40° C. to +80° C., giving a variation of the absorption wavelength of about 80 nm.

A range of tunability of this type may be easily obtained by means of a Perot-Fabry laser diode provided with an external cavity whose length is made to vary mechanically through the electrical control Sa of a piezoelectric element. The optical power sent is about 10 mW.

Laser L2

L2 is a Perot-Fabry type GaInAsP laser diode or a distributed feedback (DFB) resonator according to the signal/noise ratio desired. This laser sends power of about 10 mW in the 1.3 µm window (which is standard in optic fiber telecommunications) without any particular precision in wavelength and can be modulated in microwaves depending on the application in view. For example, it can be modulated around 10 GHz for the testing of an X band radar.

Photodiode PD

Again in the case of the X band test, PD1 will be a GaInAs planar photodiode having a capacitance of about 0.1 pF and a sensitivity of about 0.8 A/W.

Multiplexer MX

This is a passive optical component conventionally used in optical telecommunications and based for example on the use of a dichroic mirror. Its role is the coupling, in the incoming fiber Fe, of the light energies simultaneously coming from the lasers L1 and L2 respectively emitting in the windows 1.5 and 1.3 µm.

Circuit Ca

This is an electronic servo-control circuit of the transmission wavelength of L1 so as to adjust it to the absorption wavelength of MD at the time of the test. To do so, Ca seeks the signal Sa controlling L1, bringing about the maximum amplitude of the signal detected by the photodiode PD.

ADVANTAGE OF THE INVENTION

The dielectric cables (or optical fibers) do not disturb the radiation pattern of the antenna to be tested in emission mode.

Reduced volume of the assembly formed by the optical test head.

Small number of components (one optoelectronic component alone provides for the optical modulation and detection).

A servo-control system optimizing the absorption wavelength and making it possible especially to remove the need in the TOT for any temperature regulation device such as for example a thermo-element consuming electrical energy and increasing the volume and the cost.

The possibility of using several optical test heads located at different places before the antenna AN and enabling the performance of more sophisticated tests.

What is claimed is:

1. An optoelectronic system for the testing of a main antenna, comprising:
 a test antenna designed to be placed in the field of transmission/reception of the main antenna and to test a mode of operation of the main antenna;
 an optoelectronic detector/modulator associated with the test antenna and configured to communicate with remote transmission/reception circuits by modulating optical signals and to communicate using electrical signals with the test antenna;

an electric matching circuit connected between the optoelectronic detector/modulator and the test antenna.

2. The system according to claim 1, wherein:

the optoelectronic detector/modulator is capable of detecting a first light signal received from a first optical source of said remote transmission/reception circuits and providing a corresponding electrical control current to the electric matching circuit; and the electric matching circuit is configured to receive the electrical control current from the optooelectronic detector/modulator control a transmission from the test antenna to the main antenna.

3. The system according to claim 2, wherein:

the optoelectronic detector/modulator is configured to receive an electrical modulation current, to modulate a second light signal from a second optical source under the control of the received electrical modulation current, and to transmit the modulated second light signal to an optoelectronic detector said remote transmission/reception circuits, and the electric matching circuit is configured to receive a received signal from the test antenna, to apply the electrical modulation current to the optoelectronic detector/modulator and to control modulation of the second light signal by the optoelectronic detector/modulator.

4. The system according to claim 1, wherein the optoelectronic detector/modulator comprises:

a stack of layers of semiconductor materials configured to form a PIN junction and guide an optical wave in the plane of the layers;

electrodes located on either side of the layers and configured to bias the PIN junction;

a front face configured to receive incident light perpendicular to the plane of the layers and input said incident light into the stack of layers;

a rear face configured to emit light perpendicular to the plane of the stack of layers and emit a modulated wave.

5. The system according to claim 4, wherein the stack of layers comprises:

an active layer whose composition provides an energy $E_Q$ such that a first light signal received from said remote transmission/reception circuits is absorbed, wherein a second light signal transmitted from said remote transmission/reception circuits having a wavelength greater than $\lambda_Q$ wherein $E_Q = hc/\lambda_Q$, h being Planck's constant and c the speed of light.

6. The system according to claim 3, further comprising a photodetector cell configured to receive a light beam from a light source and to supply a current to the electric matching circuit.

7. The system according to claim 6, wherein transmissions between the optoelectronic detector/modulator, the first optical source, the second optical source, and the optoelectronic detector as well as between the photodetector cell and the light source are done in a non-guided optical mode.

8. The system according to claim 6, wherein transmissions between the optoelectronic detector/modulator, the first optical source, the second optical source, and the optoelectronic detector as well as between the photodetector cell and the light source are done in a guided optical mode.

9. The system according to claim 8, wherein the transmissions are done by way of optical fibers.

10. The system according to claim 9, wherein the transmissions between the optoelectronic detector/modulator, the first optical source, and second optical source are done by way of a common optical fiber, wherein said sources being connected to the common optical fiber by a multiplexing circuit.

11. The system according to claim 3, further comprising:

said optoelectronic detector; and an electrical circuit for the detection of current levels, connected to the optoelectronic detector, and configured to provide a control signal as a function of the current level detected, wherein said control signal being given to the second source to adjust the second light signal.

12. The system according to claim 3, further comprising:

a circuit configured to manage the operation of the main antenna and the optoelectronic test system, said circuit including, a control input configured to receive a test control signal, a first output configured to provide a first output signal which controls a placing of the main antenna on standby, a second output and a third output configured to provide second output and third output signals which control at different times, firstly, an emission by the main antenna of a test wave and an emission by the second source of the second light wave and, secondly, an emission by the first source of the first light wave, and a fourth output configured to provide fourth output signals which control an emission level of a supply laser of an optical test head.

13. The system according to claim 12, further comprising:

an active limiter circuit located between the main antenna and said optoelectronic detector/modulator and configured to introduce a high insertion loss into the circuit when the main antenna is operated in an emission mode and to introduce only a low insertion loss when the test antenna is operated in an emission mode.

14. The system according to claim 13, wherein the active limiter circuit is configured to be activated by the circuit at the same time as it controls a transmission by the test antenna.

15. The system according to claim 13, further comprising:

a photodetector cell configured to receive a light beam from a light source and supply a current to the electric matching circuit;

wherein the active limiter circuit is configured to be deactivated due to a supply voltage related to the power received by the photodetector cell.

16. The system according to claim 6, further comprising:

a signal analyzer connected to the photodetector cell; and a management circuit configured to control an operating test of the optoelectronic testing system by controlling a modulation of light emitted by said light source in such a way that the modulated light modulates a function of a limiter circuit, said modulation being passed on to the signal transmitted by the test antenna to the optoelectronic detector/modulator.

17. A method of testing a main antenna, comprising steps of:

placing a test antenna having an optoelectronic detector/modulator and an electric matching circuit in the field of transmission of said main antenna;

operating in a first test mode comprising, transmitting a first optical signal to said optoelectronic detector/modulator from outside said field of transmission of said main antenna, converting said first optical signal to a first electrical current by means of said optoelectronic detector/modulator, and applying the first electrical current to said test antenna via said electrical matching circuit to produce transmission of a first radiated test signal from the test antenna to said main antenna, and receiving the first radiated test signal by the main antenna; and operating in a second test mode, comprising, transmitting a second radiated test signal from the main antenna to the test antenna for reception by the test antenna, applying second radiated test signal received by the test antenna to the electric matching circuit to produce a second electrical current, applying the second electrical current to the optoelectronic detector/modulator and modulating a second optical signal using said second electrical current, and transmitting the second optical signal to outside the field of transmission of said main antenna.

18. The method of claim 17, wherein said step of transmitting an optical signal further comprises:

generating said first optical signal using a first optical source, wherein said first optical signal is changed at said optoelectronic detector/modulator of said test antenna into said electrical signal.

19. An optoelectronic system for the testing of a main antenna, comprising:

a test antenna means for transmitting and receiving a radiofrequency signal placed in a field of radiofrequency transmission/reception of the main antenna and for testing a mode of operation of the main antenna;

means for converting between an electrical signal and an optical signal and modulating an optical signal, wherein said optical signal is received from and said modulated optical signal transmitted to outside said field of transmission/reception of the main antenna;

means for matching said received and transmitted radiofrequency signal with said electrical signal.

* * * * *